United States Patent [19]

Malmberg et al.

[11] 3,956,698

[45] May 11, 1976

[54] CONTACTLESS TEST METHOD FOR INTEGRATED CIRCUITS

[75] Inventors: Paul R. Malmberg, Pittsburgh, Pa.; Robert M. Handy, Phoenix, Ariz.; Donald F. Stoneburner, Monroeville, Pa.; David Green, Painted Post, N.Y.

[73] Assignee: Westinghouse Electric Corporation, Pittsburgh, Pa.

[22] Filed: Feb. 12, 1974

[21] Appl. No.: 441,924

[52] U.S. Cl. ............................. 324/158 R; 324/73 R; 324/158 D
[51] Int. Cl.² ........................................ G01R 31/26
[58] Field of Search ........ 324/158 R, 158 D, 158 T, 324/73 R, 54; 340/173 CR, 174 YC

[56] References Cited
UNITED STATES PATENTS

| | | | |
|---|---|---|---|
| 3,506,971 | 4/1970 | Sakurai | 340/173 CR |
| 3,549,999 | 12/1970 | Norton | 324/158 D |
| 3,678,384 | 7/1972 | Oatley | 324/73 R |
| 3,772,520 | 11/1973 | Varker | 324/54 |
| 3,801,910 | 4/1974 | Quinn | 324/158 D |

OTHER PUBLICATIONS
Donath, W. E.; "Testing of Integrated Circuits"; IBM Tech. Dis. Bull.; Vol. 8; No. 8; Jan. 1966.

*Primary Examiner*—R. V. Rolinec
*Assistant Examiner*—Ernest F. Karlsen
*Attorney, Agent, or Firm*—C. L. Menzemer

[57] ABSTRACT

A method is provided for contactless testing of an integrated circuit by fabricating, integrally with the integrated circuit, semiconductor switch elements, that is, thyristors, transistors and combinations thereof, that are connected to power and/or signal electrical inputs of the integrated circuit. Base regions of the switch elements are selectively exposed to a fine-dimensioned electron beam to switch the elements and supply desired electrical inputs at the connected inputs of the integrated circuit. The integrated circuit can thus be selectively tested preferably by segments and modules. After testing, the switch elements are disconnected from the integrated circuit, and the integrated circuit selectively connected preferably while accommodating and passivating defective components and modules of the circuit.

12 Claims, 7 Drawing Figures

CONTACTLESS TEST METHOD FOR INTEGRATED CIRCUITS

GOVERNMENT CONTRACT

This invention was made in the course of or under United States Government Contract No. F 33615-C-1335.

FIELD OF THE INVENTION

The present invention relates to the testing of integrated circuits and other micro-miniature electronic components without the use of mechanical test probes.

BACKGROUND OF THE INVENTION

Integrated circuit technology is producing circuits with increasing complexity and component density. Elements as small as 1 and 2 microns in size can be produced using an electron image projection system described in U.S. Pat. No. 3,679,497, granted July 25, 1972. As a result, memory cells as small as $1.2 \times 10^{-6}$ cm$^2$ and gate areas as small as $4 \times 10^{-6}$ cm$^2$ are achievable, which should permit fabrication of an enitre 20,000 gate logic, 256,000 bit memory computer on a 1 cm$^2$ semiconductor wafer.

One of the severely limiting factors on such micro-miniaturization is the testing procedure necessary to the circuit fabrication. It is practically impossible to manufacture, a defect-free complex integrated circuit. Thus, during and/or after fabrication, the individual segments and modules of the circuit must be separately tested to determine whether the electrical characteristics are in accord with the design values within allowable tolerances. At present, such testing is done with mechanical probes which physically contact the input and output electrodes of the individual segments and modules so that a test device can measure the input and/or output voltage and current.

The problem is that the smallest area of metal which can be satisfactorily contacted mechanically with a fine wire probe system is about $75 \times 75$ microns — larger than the individual logic gates of a high density integrated circuit. The test points become too numerous and too closely spaced to be mechanically contacted when the circuit is micro-miniaturized. Testing by mechanical probe thus places a limit on the density of the circuit unrelated to fabrication capabilities and limitations.

Further, testing by mechanical probes can cause severe damage to the integrated device. Although fine wire test probes may seem very flexible to a human observer, they are very stiff and heavy relative to the fine structure of integrated circuits. Mechanical probes (i) can contaminate and abrade the device surfaces so that subsequent fabrication steps, e.g. final metalization, cannot be effectively accomplished, and (ii) can exert high localized forces and introduce localized stresses so that active regions of the device are dislocated and distorted. In addition, a mechanical probe can score electrodes and damage oxide layers. Quality control and quantitative yields can, therefore, be increased by eliminating mechanical probes.

A finely-focused electron beam in a vacuum chamber can in some instances be used as a contactless probe in the testing of planar electron devices, and particularly integrated circuits, in place of mechanical contact probes. Under control from a digital computer, the electron beam can be very accurately addressed to coordinate locations on an integrated circuit at high speed. However, the use of an electron beam for contactless testing of integrated circuits is very restricted in its applications.

The use of multiple electron beams in contactless testing is virtually impossible. The apparatus for such multiple beams is bulky and requires separate control of the beams. Further, tremendous difficulty is encountered in isolation of the beams and in accurately addressing the beams relative to each other. As a result, only a single small-dimensioned electron beam is practicable for contactless testing. However, a single electron beam cannot hold both an input signal at a desired level at one address and also go to other coordinate addresses to, for example, set other input conditions of the circuit. Moreover, testing circuits with an electron beam presents difficulties in deenergizing or isolating circuits not being tested while energizing the particular segment or module under test.

The present invention overcomes these difficulties and disadvantages. It permits one or more input conditions to be set by an electron beam and held at a desired level while the electron beam sets other input and output electrical characteristics and the input and/or output electrical characteristics are tested. It permits contactless testing of a single circuit module while the other circuit modules on an integrated circuit chip are maintained in a deenergized condition.

SUMMARY OF THE INVENTION

A method is provided for contactless testing of integrated circuits and particularly selective testing of segments and modules of high density integrated circuits. Specifically, small circuit segments and preferably modules of an integrated circuit are selectively energized, and preferably also deenergized, with an electron beam so that a large number of circuit segments or modules and/or a large number of inputs and outputs of a particular circuit segment or module can be rapidly tested without mechanical damage to the circuit. Thereafter, the good circuit modules or segments are preferably selectively connected in large scale integrated circuits by computer-derived wiring techniques.

The integrated circuit to be tested is fabricated preferably in modules. Semiconductor switch elements such as transistors, thyristors or a combination thereof as hereinafter described, are fabricated integrally with the integrated circuit with an input thereof adapted for connection to an electrical power or signal source and an output thereof connected to an input of said integrated circuit. Said switch elements have base region configurations capable of exposure to and switching by an electron beam of fine dimensions to supply at the connected input to said integrated circuit a desired electrical input. Preferably, where the circuit is fabricated in modules, at least one semiconductor switch element is provided for each power and each signal input to each module.

Thereafter, the inputs of the switch elements are connected to power and signal electrical sources, respectively. Base regions of the switch elements are then selectively exposed to a fine-dimensioned electron beam, preferably from a standard electron microscope, to selectively switch the elements and selectively supply the desired electrical power and signals at the connected inputs to the integrated circuit. Electrical responses of at least segments of the integrated circuit to said electrical inputs are then selectively measured to determine whether said segments possess specified electrical characteristics. Where the integrated circuit is fabricated in modules, the modules are thus selectively and sequentially supplied with electrical power and signal inputs by selective exposure of the semiconductor switch elements and the responses measured to determine whether each module possesses the specified electrical characteristics based on the inputs.

In certain embodiments, each switch element is preferably fabricated so that it comprises an electron-activated thyristor and an electron-activated transistor in parallel. By this arrangement, the desired electrical inputs supplied to the integrated circuit can be deenergized as well as energized to provide for more rapid testing of the integrated circuit. Alternatively, multiple power and signal inputs can be simultaneously supplied to the integrated circuit by fabricating at least some of the switch elements as transistors with their electron-activated base region in close proximity.

Where multiple signal or power levels are needed at one input to test a given segment or module, it is preferred that a plurality of semiconductor switch elements, with different resistance values corresponding to the desired input levels, be fabricated along with the integrated circuit and ohmically connected to one input of said integrated circuit. The segment or module can thus be tested at the desired input levels by successive exposure of the switch elements, or combinations thereof, while the measurement of electrical response of said segment or module is continued to determine whether the segment or module possesses specific electrical characteristics based on the electrical inputs.

In any case, the semiconductor switch elements are disconnected from the integrated circuit after testing. Thereafter, the segments or modules which test good are selectively electrically connected, and/or the segments or modules which are found defective are selectively electrically disconnected from the integrated circuit.

Other details, objects and advantages of the invention will become apparent as the following description of the presently preferred embodiments and presently preferred methods of performing the invention proceeds.

BRIEF DESCRIPTION OF THE DRAWINGS

Referring to the drawings, the present preferred embodiment of the invention and present methods of performing the invention are illustrated, in which.

DESCRIPTION OF THE PREFERRED EMBODIMENTS

Figure 1:
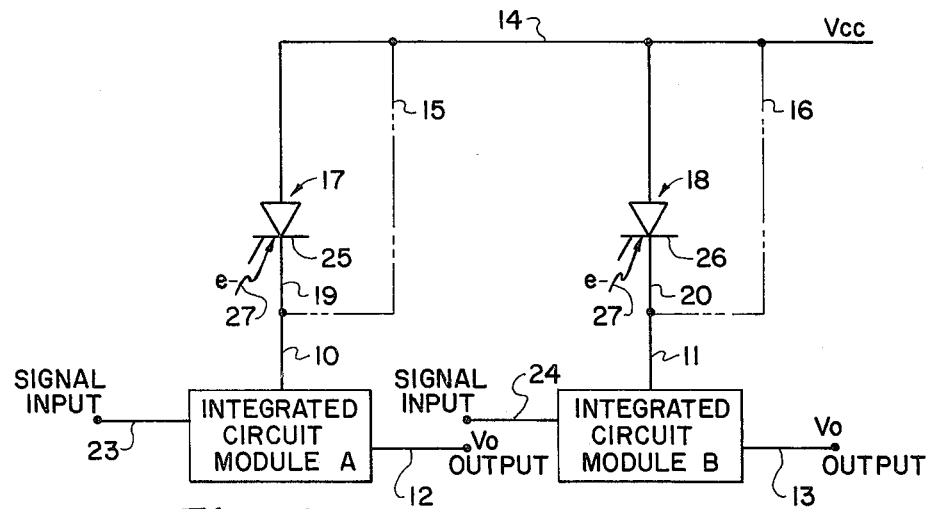
FIG. 1 is a circuit diagram showing means for performing the present invention.

Referring to FIG. 1, a circuit diagram is shown of an integrated circuit made utilizing the present invention. The integrated circuit preferably of high density is built, including integrated circuit segments or modules A and B, preferably by use of the electron image projection system. Modules A and B are any integrated circuit modules requiring testing, e.g. transistor-transistor logic circuits and transistor-diode logic circuits. As part of the integrated circuit structure, modules A and B are provided with power input leads 10 and 11, respectively, signal input leads 23 and 24, respectively, and output leads 12 and 13, respectively. The modules are designed to be supplied with power through leads 10 and 11 and leads 15 and 16 from common supply bus 14; but at the test stage as hereinafter described, leads 15 and 16 are not yet connected to the circuit modules. The signal input is typically supplied to the modules through leads 23 and 24 from external contact pads or other parts of the integrated circuit.

Also fabricated as part of the integrated circuit structure are semiconductor switch elements 17 and 18 having output leads 19 and 20, respectively, ohmically connected to power input leads 10 and 11 of circuit modules A and B, respectively. Switch elements 17 and 18 have base regions 25 and 26, respectively, of configurations so that the switch elements are capable of selective exposure to and switching by an electron beam 27 of fine dimensions. Switch elements 17 and 18 also have input leads 21 and 22 connected to the common power supply bus 14.

Semiconductor switch elements 17 and 18 are typically conventional electron-activated thyristors with a four-layer structure. The switching of the elements thus involves changing the mode of each device from the high impedance blocking state to the low impedance conducting state by exposing the cathode-base region to electron beam 27. The element will remain in the low impedance state so long as the supply current is applied.

Alternatively, semiconductor switch elements 17 and 18 are conventionally electron-activated transistors with a three-layer structure and preferably a relatively long turn-off time. Preferably, such transistors reach a saturation condition on exposure to the element beam so that substantial stored charge remains in the base region at the end of the exposure and a long turn-off time results. The long turn-off time enables the transistor to remain in a conducting state long enough for the electron beam to be deflected elsewhere in the circuit to perform other functions, e.g. turn-on other inputs, etc.

After fabrication of the integrated circuit, switch elements 17 and 18 are selectively exposed to electron beam 27 to switch the elements to the low impedance state and alternatively supply the desired electrical input signal to the circuit module A or B through input lead 10 or 11. electron beam 27 is preferably a fine-dimensioned beam projected by a standard scanning electron microscope so that the beam can be accurately addressed and deflected at high speed to various locations within a relatively large scan field. In this connection, it should be noted that the switching operation of each switch element involves a multiplication by many times of the electron beam current. That is, the electron beam current is many times the resulting electrical current from the switch element. This multiplication results from the fact that an electron (** 3.5 ev) bombarding the base region produces a large number of electron-hole pairs and in turn a large number of carriers. Typical values for incident beam energy and resulting electrical current are $10^4$ volts and $10^{-8}$ amperes. While only a fraction of the carriers reach the junction before recombination (e.g. 5%), the gain factor is considerably higher than the base-collector current gain of the switch element which also multiples the current outputs.

Then, the circuit modules A and B are selectively tested by measuring the current or voltage response in external output or input leads to the supply of the electrical input which typically includes, in addition to the power input, a signal input through lead 23. It should be emphasized that the electrical response of the module can be tested by measuring the total current supplied through bus 14 because the module being tested is subtantially isolated from the remainder of the circuit, except for desired input signals through leads 23, and in turn leakage currents through other parts of the circuit cannot obscure the load current variations by the module being tested.

After testing, the output leads 19 and 20 from the switch elements 17 and 18 to input leads 10 and 11 of the circuit modules are disconnected; and preferably in immediate sequence, the leads 15 and 16 are formed to ohmically connect the inputs 10 and 11 to the supply bus 14 if desired. Preferably, these steps are accomplished by (i) selective metalization with standard vapor or sputter deposition techniques to deposit metal layers in the areas of the integrated circuit where leads 15 and 16 are to be formed, and (ii) photo- or electro-masking and selective etching of the newly formed metal layers and the leads 19 and 20. The switch elements used in testing are thereby disconnected and the input power supply leads connected at the same time.

Figure 2:
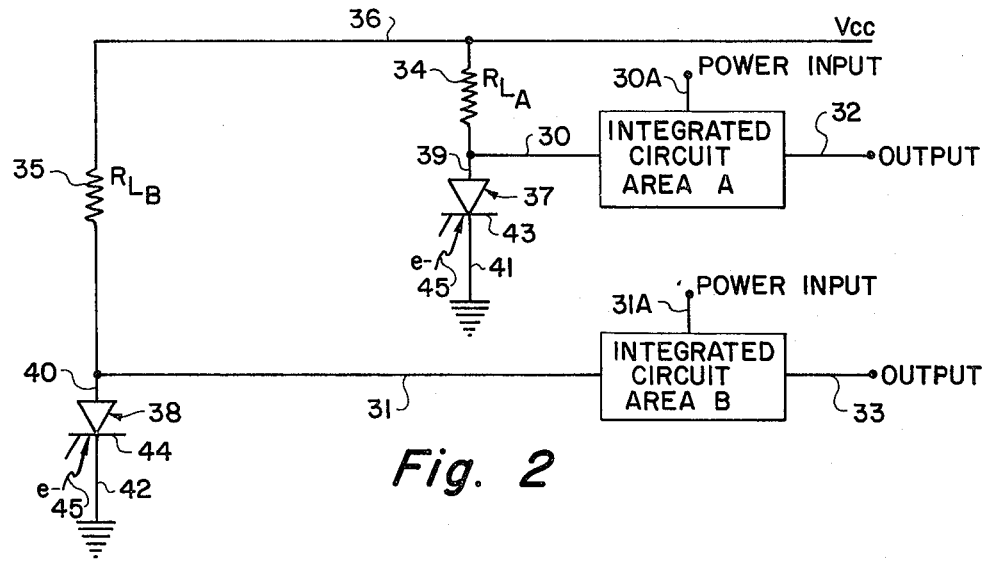
FIG. 2 is a circuit diagram showing alternative means for performing the present invention.

Referring to FIG. 2, an alternative or complimentary integrated circuit utilizing the present invention is shown where modules A and B have signal inputs 30 and 31, power inputs 30A and 31A, and outputs 32 and 33, respectively. Inputs 30 and 31 are connected through load resistors 34 and 35 to supply bus 36. Power is supplied to the modules through leads 30A and 31A and preferably through switch elements as shown in FIG. 1. Semiconductor switch elements 37 and 38 are the same as switch elements 17 and 18 described in connection with FIG. 1 except for differences in electrical characteristics because of the differences between power and signal inputs. Elements 37 and 38 are connected to inputs 30 and 31, respectively, by input leads 39 and 40 and by output leads 41 and 42 connected to ground so that inputs of the semiconductor switch elements are also connected indirectly through load resistors 34 and 35 to supply bus 36.

By this arrangement, the circuit modules A and B are selectively tested by selectively exposing base regions 43 and 44 of switch elements 37 and 38 with electron beam 45. That is, the switch elements connected to circuit modules or segments to other than the module or modules to be tested are exposed so the input load from the supply bus 36 is shunted to ground through the exposed switch elements. This embodiment is particularly useful in testing logic circuits where the circuit modules must be tested in both on and off signal input conditions.

A difficulty with the use of the embodiments shown in FIGS. 1 and 2 is that usually the power to the entire circuit must be turned off at the supply bus between the test of each circuit module or segment. This turn-off permits thyristor switch elements to return to the blocking state so that another circuit module can be isolated and selectively tested. This turn-off is not necessary where the switch elements are transistors, which provides an advantage with transistor switch elements. However, as pointed out above, the testing time is limited with transistor switch elements to the turn-off time of the transistor if the electron beam must be moved to another location in the circuit to accomplish the desired test. Thyristor switch elements are therefore generally used and the testing procedure is substantially slowed by the need to turn-off the power supply between each test sequence, and discharge and recharge the relatively large capacitance of the power supply bus.

Figure 3:
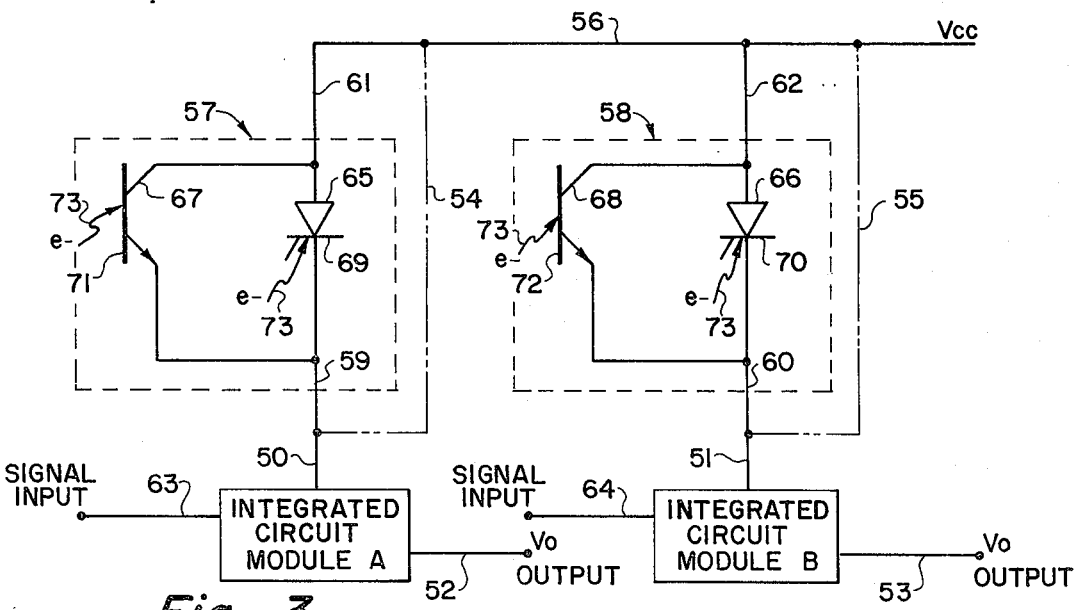
FIG. 3 is a circuit diagram showing second alternative means for performing the present invention.

Referring to FIG. 3, a second alternative integrated circuit utilizing the present invention is shown where the need to turn-off the external power supply between each test is avoided. Circuit modules A and B of the integrated circuit have power inputs 50 and 51, signal inputs 63 and 64, respectively, and outputs 52 and 53 respectively. These circuit modules are designed to be supplied with power through leads 54 and 55 from a common supply bus 56; but at the test stage as hereinafter described, leads 54 and 55 are not yet connected to the circuit modules. An electrical signal input is also typically supplied to the modules through leads 63 and 64 from external contact pads or other parts of the integrated circuit.

Also fabricated as part of the integrated circuit structure are semiconductor switch elements 57 and 58 having output leads 59 and 60, respectively, connected to input leads 50 and 51 of circuit modules A and B, respectively. Switch elements 57 and 58 are connected by input leads 61 and 62 to common power supply bus 56.

Switch elements 57 and 58 in this embodiment comprise electron-activated thyristors 65 and 66 and electron-activated transistors 67 and 68. The thyristor and transistor of each switch element 57 and 58 are connected in parallel between the input and output leads. The thyristors and transistors also have base regions 69, 70, 71 and 72, respectively, of configurations so that the transistors and thyristors are each capable of exposure to and switching by electron beam 73 of fine dimensions.

In this embodiment, the input power to each circuit module can be selectively turned-off as well as on by the electron beam. For example, if circuit module A is to be tested, base region 69 of thyristor 65 would be selectively exposed to electron beam 73 to switch the thyristor 65 and in turn switch element 57 to the low impedance state and supply the desired electrical input signal to the circuit module A at power input leads 50. The circuit module A is then selectively tested by measuring the current or voltage response in external leads 52 and 56 on supply of the desired electrical inputs to the module, which typically includes in addition to the power input, a signal input through lead 63.

After completion of the test, electron beam 73 is deflected to expose base region 71 of transistor 67. The voltage drop through transistor 67 on exposure by the electron beam is such that the current is caused to shunt through transistor 67 and cause the current flow through thyristor 65 to reduce below the holding current and cause the thyristor to resume the high impedance blocking mode. After the electron beam is removed from base region 71, transistor 67 also assumes a non-conductive state and module A is thus deenergized. Thereafter circuit module B can be powered and tested by the same procedure without first turning off the power supply in the external power bus 56. This embodiment, of course, provides a much more rapid off technique than deenergizing the entire integrated circuit because (i) the relatively large capacitance of the power supply bus does not have to be discharged and recharged for test of each circuit module and (ii) the electron beam can be deflected at high speed to the transistor to turn-off the switch element.

Figure 4:
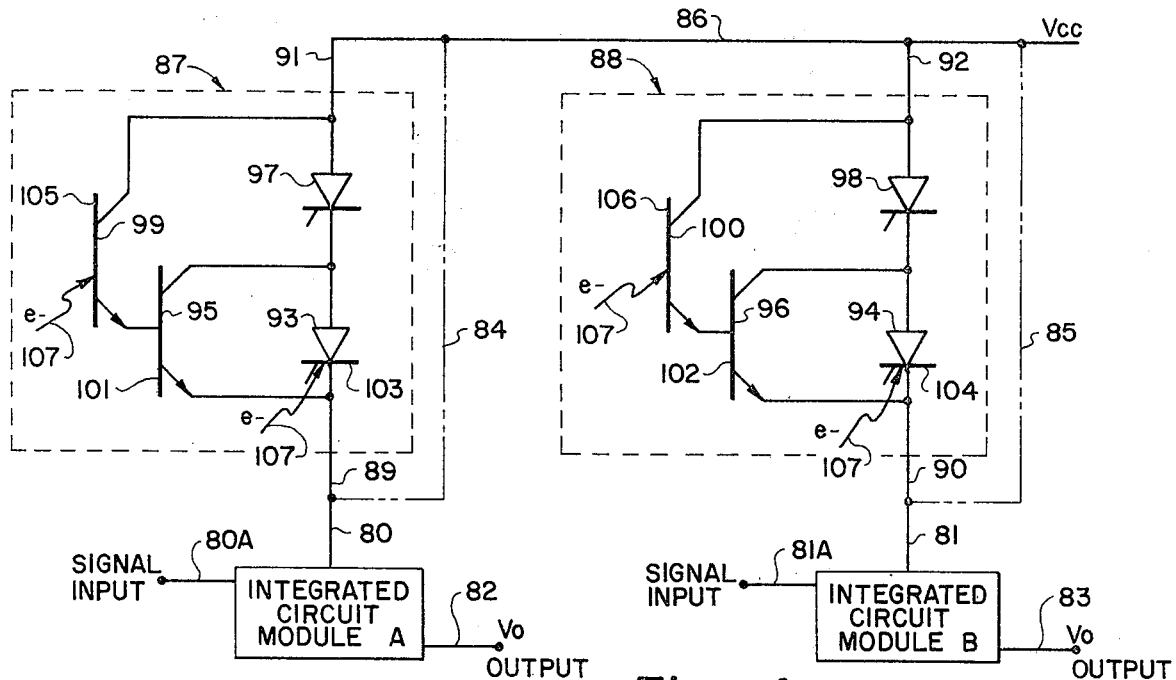
FIG. 4 is a circuit diagram showing third alternative means for performing the present invention.

Referring to FIG. 4, a third alternative integrated circuit utilizing the present invention is shown where the desired electrical power needed at the circuit modules is so large that it cannot be directly turned off by shunting with an electron-activated transistor. Specifically, modules A and B have power inputs 80 and 81, signal inputs 80A and 81A and outputs 82 and 83, respectively. Modules A and B are designed to be connected to and supplied with power through leads 84 and 85, respectively, from supply bus 86; but at the test stage as hereinafter described, leads 84 and 85 are not yet connected to the circuit modules. Again, an electrical signal input is also typically supplied to the modules through leads 80A and 81A from an external source or other parts of the integrated circuit.

Fabricated as part of the integrated circuit structure are semiconductor switch elements 87 and 88 having output leads 89 and 90, respectively, ohmically connected to power input leads 80 and 81 of circuit modules A and B, respectively. Switch elements 87 and 88 are also connected by input leads 91 and 92 to the common power supply bus 86.

Switch elements 87 and 88 comprise electron-activated thyristors 93 and 94, respectively, and transistors 95 and 96 connected in parallel with thyristors 93 and 94, respectively. Switch elements 87 and 88 also have diodes 97 and 98, respectively, in series with thyristor 93 and transistor 95 and with thyristor 94 and transistor 96, respectively; and electron-activated transistors 99 and 100, respectively, in parallel with the respective diodes 97 and 98 and in series with collector-base portions of the respective transistors 95 and 96. Thyristors 93 and 94 and transistors 99 and 100 have base regions 103, 104, 105 and 106, respectively, of configurations so that the devices are capable of exposure to and switching by an electron beam 107.

By this arrangement, the circuit modules A and B can be selectively supplied with the desired high level electrical input power and possibly other input signals, tested, and thereafter turned off so that another circuit module may be selectively tested. For example, circuit module A is selectively tested by first exposing the base region 103 of thyristor 93 to electron beam 107 to cause the thyristor 93 to change from the blocking mode to the conducting mode, and in turn supply the desired high level electrical input power to the circuit module A through input lead 80. The circuit module A is then selectively tested by measuring the current and/or voltage response in the external input or output leads 82 or 86 to the supply of the electrical inputs which again typically includes in addition to the power input, a signal input through lead 80A.

After testing, said input power to the module A is switched off by exposing base region 105 of transistor 99 to electron beam 107. Because of the blocking voltage provided by diode 97, the current is shunted through electron-activated transistor 99 so that transistor 95 is driven into saturation, thereby causing the high power electrical input to shunt through transistor 95 and drop the current flow through thyristor 93 below the holding current level. Thyristor 93 is thus caused to reassume its blocking mode and, with removal of the electron beam from transistor 99, turn off the electrical signal to input 80 of integrated circuit module A. This mode of turn-off of the thyristor is called a "cascade" turn-off.

The same procedure can thereafter be followed in selectively supplying power to the input 81 of circuit module B, testing circuit module B typically with additional signal inputs, and thereafter turning off the switch element 88 by electron beam exposure of base region 106 of transistor 100 and cascade shunting and turn-off of thyristor 94. Similarly, cascade shunting can also be used in turning on and off electrical input signals instead of input power.

Figure 5:
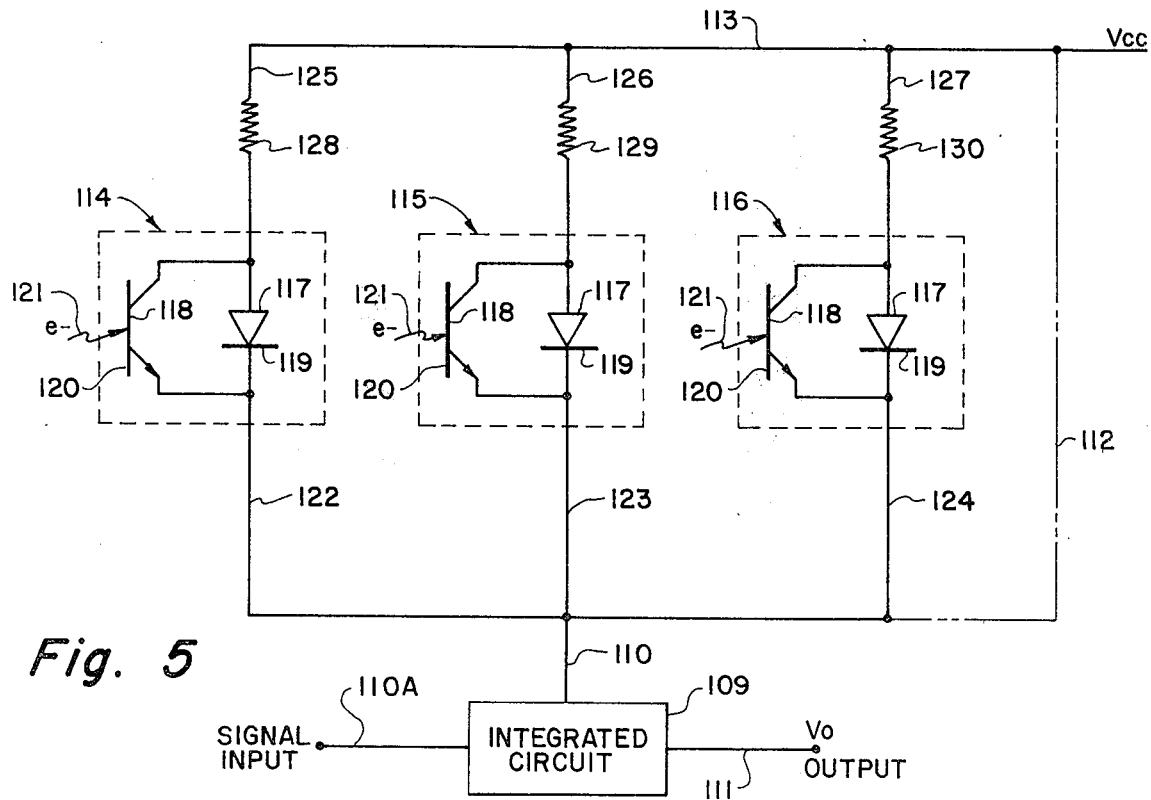
FIG. 5 is a circuit diagram showing fourth alternative means for performing the present invention.

Referring to FIG. 5, a fourth alternative integrated circuit is shown utilizing the present invention in which a plurality of electrical power inputs at different levels are selectively supplied to one input of the integrated circuit 109. Integrated circuit 109 is again preferably of high density built by the electron image projection technique. The integrated circuit has power input 110, signal input 110A and output 111. The integrated circuit is designed to be supplied with power through lead 112 from power supply bus 113; but at the test stage as hereinafter described, lead 112 is not yet connected to the integrated circuit. The circuit is also designed to be supplied with an input signal from an external circuit or other part of the integrated circuit through lead 110A.

Also fabricated as part of the integrated circuit structure are semiconductor switch elements 114, 115 and 116. Each switch element is comprised of electron-activated thyristor 117, and electron-activated transistor 118 connected in parallel with the thyristor 117. Thyristor 117 and transistor 118 also each have base regions 119 and 120, respectively, of configurations so that the devices are capable of exposure to and switching by an electron beam 121. Electron beam 121 is preferably a fine-dimensioned beam projected by a scanning electron microscope so that it accurately can be addressed and deflected at high speed to various locations within a relatively large scan field.

Switch elements 114, 115 and 116 also are comprised of output leads 122, 123 and 124, respectively, ohmically connected to power input lead 110 of the integrated circuit 109. Switch elements 114, 115 and 116 also are connected by input leads 125, 126 and 127 through resistors 128, 129 and 130, respectively, to supply power to the respective switch elements from the common power supply bus 113.

By this arrangement, the electrical signal inputted to the integrated circuit 109 can be selected by selectively exposing the base region of one or more of the thyristors of switch elements 114, 115 and 116 with the electron beam 121. The power inputted to the integrated circuit at power lead 110 is dependent upon the value of resistors 128, 129 and 130.

Preferably, the power supply is varied so that the voltage from supply bus 113 to power input lead 110 remains substantially constant. In this situation the resistors preferably have weighted values in the ratios of 1:2:4. That is, resistor 128 has a unit resistance of 1, resistor 129 has a unit resistance of 2, and resistor 130 has a unit resistance of 4. By this weighting of the resistors relative to each other, the current levels which can be supplied to the integrated circuit 109 through lead 110 can range in discrete levels from 0 to 7 times the current level which can be supplied to input 110 through resistor 128 and switch element 114. That is, by switching switch elements 114, 115 and 116 in various combinations, the current level at input 110 can range from 0 to 7 in discrete levels of 0, 1, 2, 3, 4, 5, 6, and 7. The current level at input 110 can also be changed downwardly simply by irradiating the base of the appropriate transistor 120 of switch elements 114, 115 or 116 so that the thyristor thereof resumes the blocking state as explained in connection with FIG. 3.

Figure 6:
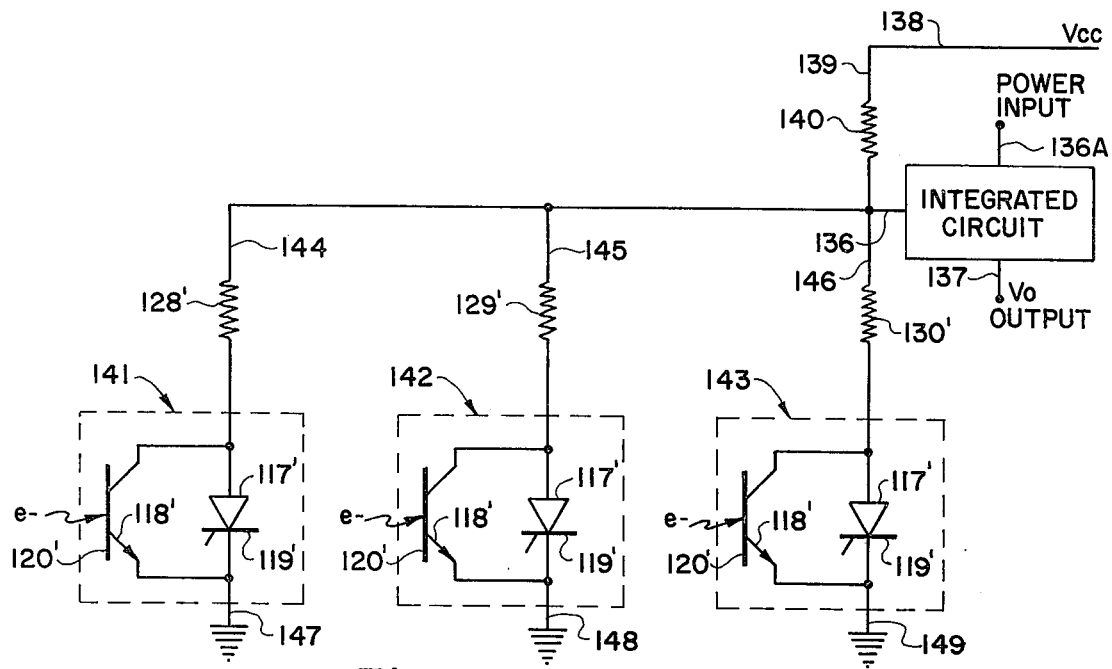
FIG. 6 is a circuit diagram showing fifth alternative means for performing the present invention.

Referring to FIG. 6, an alternative multi-level signal input arrangement of the present invention is shown. An integrated circuit 135 is shown having signal input 136, power input 136A, and output 137. The signal input 136 is connected by lead 139 through load resistor 140 to power bus 138. Semiconductor switch elements 141, 142, and 143, as described in connection with FIG. 5, are connected to input 136 by input leads 144, 145 and 146, respectively, and by output leads 147, 148 and 149 to ground so that the inputs of the semiconductor switch elements are also connected indirectly to power supply bus 138. By this arrangement, the input signal to integrated circuit 135 through input 139 and load resistance 140 can be produced in discrete levels depending upon the values of resistors 128', 129' and 130'. Again, it may be preferred that the voltage be maintained substantially constant and the resistors have related ohmic values according to the ratios 1:2:4. In this way the multiple current level inputs to integrated circuit 135 relate to each other, and equally spaced discrete current levels can be supplied to the integrated circuit 135.

Figure 7:
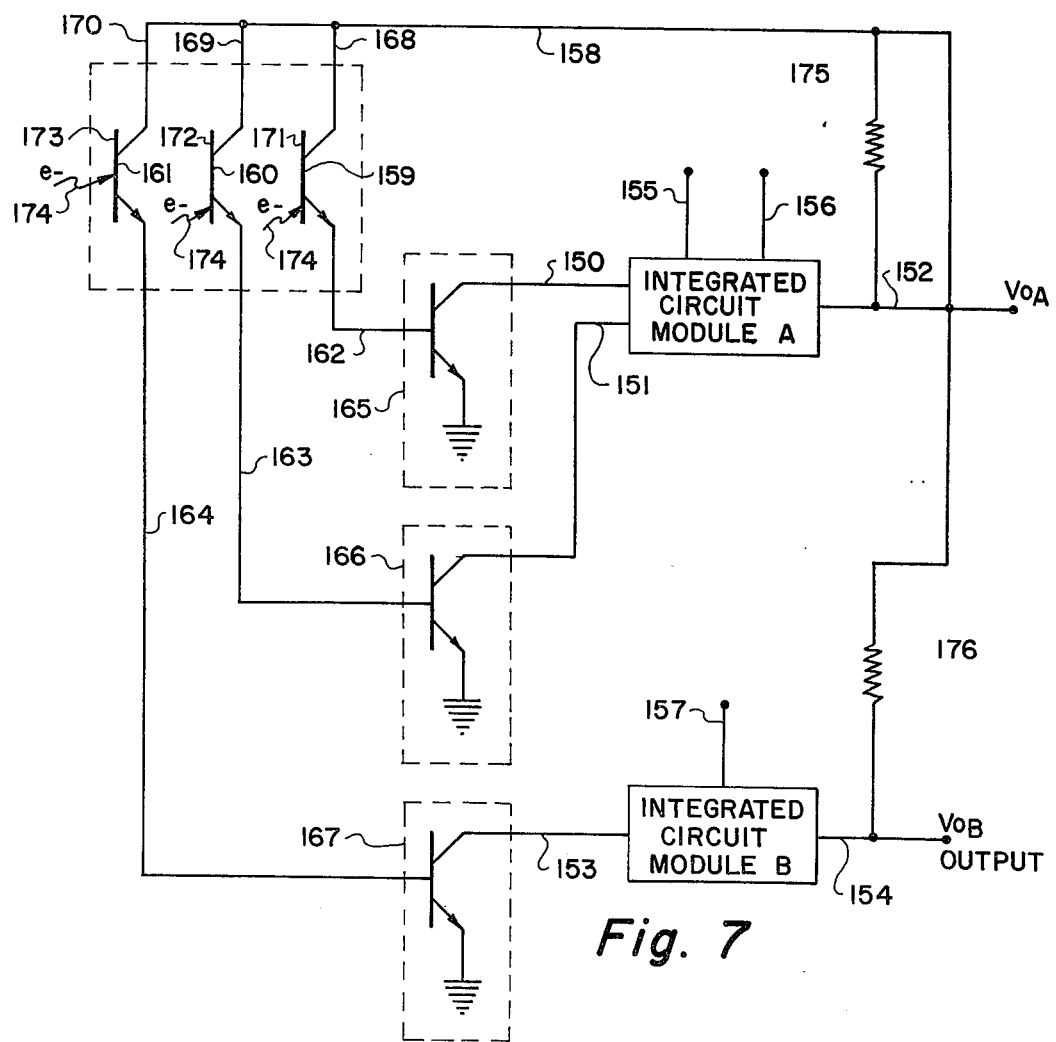
FIG. 7 is a circuit diagram showing sixth alternative means for performing the present invention.

Referring to FIG. 7, still another alternative embodiment of an integrated circuit made utilizing the present invention is shown. The integrated circuit, which includes integrated circuit modules A and B, preferably is again a high density circuit built by use of the electron image projection system. As part of the circuit structure, module A is provided with input signal leads 150 and 151 and output lead 152, and module B is provided with input signal lead 153 and output lead 154. The modules are designed to be connected by leads 155, 156 and 157; but at the test stage as hereinafter described, leads 155, 156 and 157 are not yet connected to the circuit modules.

Also fabricated as part of the integrated circuit structure are semiconductor switch elements 159, 160 and 161, each comprised of an electron-activated transistor. Switch elements 159, 160 and 161 have output leads 162, 163 and 164, respectively, connected through amplifier circuits 165, 166 and 167, respectively, to input leads 150, 151 and 152, respectively. Switch elements 159, 160 and 161 also have input leads 168, 169 and 170 to supply power to the respective switch elements from the common power supply bus 158. Switch elements 159, 160 and 161 also have base regions 171, 172 and 173, respectively, in close proximity and of configurations so that the switch elements can be exposed to and simultaneously switched by electron beam 174.

Electron beam 174 is again preferably a standard fine-dimensioned beam that is projected by a scanning electron microscope so that the beam can be accurately addressed and deflected at high speed to various locations within a relatively large scan field. The close proximity of the base regions 171, 172 and 173 to each other permits the electron beam to be deflected from one base region to the other at a frequency sufficiently high to bridge the turn-off time of the transistors and thereby selectively maintain one or more or all of the transistors in the conducting mode during the testing of the circuit modules A and B, as desired.

For example, the electron beam may be deflected between base regions 171 and 172 of switch elements 159 and 160, respectively, to provide the desired electrical inputs at inputs 150 and 151 of circuit module A during testing of that module. Thereafter, the electron beam can be deflected to base 173 of switch element 161 to provide the input at 153 to the circuit module B for testing thereof.

Amplifier circuits 165, 166 and 167 are provided to boost the typically small current produced by the incidence of the electron beam 174 on the exposed switch element or elements. Further, the current gain of the amplifier circuits can be selected and controlled to provide the desired electrical inputs at inputs 150, 151 and 153.

As previously described, the circuit modules A and B may be tested by measuring the response or variation in electrical load level of the power supply 158 because the module being tested is isolated from the remainder of the circuit. FIG. 7 shows how the accuracy of this method can be enhanced by use of special low-value load resistors 175 and 176 of different values. Resistors 175 and 176 are connected between the outputs 152 and 154, respectively, of the circuit modules A and B and the power supply bus 158. Resistors 175 and 176 are generally 4 to 10 times lower in value than the load resistance within the respective integrated circuit modules. These resistors are formed as part of the integrated circuit and are subsequently disconnected from the integrated circuit during processing steps subsequent to testing as herein otherwise described. The presence of resistors 175 and 176 permit differentiation in the various input and output conditions for checking desired (or specified) performance. This measurement is particularly useful in the testing of logic circuit modules with a relatively small number of gates.

As previously described in connection with FIG. 1, the semiconductor switch elements are disconnected from the integrated circuit after testing. Also, leads and load resistors may be simultaneously formed to ohmically supply the design power supply and signal inputs to and between the various segments and modules of the integrated circuit. This step is equally applicable in the processing, after testing, of the embodiments shown in FIGS. 2 through 7.

If a circuit is found to be bad on testing, it is preferably simply disconnected from the remainder of the integrated circuit during the subsequent disconnection step along with the switch elements. In this connection, it is preferred that the integrated circuit be fabricated with more modules than is necessary to accomplish the designed purpose of integrated circuit. In this way, the yield of the integrated circuit can be increased — in some cases, e.g. computer memories, to almost 100% — by accommodation and passivation of the defective circuit segments and modules within the finished integrated circuit. This is readily done, after testing of all of the circuit segments and modules, with a computer-derived photomask or electromask which will permit connection of the good modules and/or disconnection of the defective modules by known lithographic and etch techniques. It should also be noted in this connection that any defects in the switch elements are preferably treated as a defect in the integrated circuit segment or module under test to eliminate the need for testing the switch elements before the testing of the integrated circuit; this preferance is accomplished simply by inclusion of sufficient redundancy into the integrated circuit that the probable defects in the switch elements can be accommodated and passivated.

While the presently preferred embodiments have been shown and described with particularity, it is distinctly understood that the invention may be otherwise variously performed within the scope of the following claims.

What is claimed is:

1. A method of contactless testing of an integrated circuit comprising the steps of:
   A. fabricating integrally with an integrated circuit to be tested at least one semiconductor switch element (i) having an input adapted for electrical connection to an electrical source and an output electrically connected to an input of said integrated circuit, and (ii) having a base region configuration capable of exposure to and switching by an electron beam to supply at the connected input to said integrated circuit a desired electrical input;
   B. connecting inputs of said semiconductor switch elements to an electrical source;
   C. selectively exposing the base regions of at least one switch element with a electron beam to actuate said switch element and supply a desired electrical input to said integrated circuit from the electrical source; and
   D. measuring electrical responses of at least a segment of the integrated circuit to said electrical input to determine whether said circuit segment possesses specified electrical characteristics.

2. A method of contactless testing an integrated circuit as set forth in claim 1 wherein:
   the fabrication step includes forming a plurality of semiconductor switch elements with different resistance values and having outputs ohmically connected to one input to said integrated circuit; and
   the exposure step includes selectively supplying a plurality of electrical inputs of different voltage levels at the connected input of said integrated circuit.

3. A method of contactless testing an integrated circuit as set forth in claim 1 wherein:
   the fabrication step includes forming one electron-activated thyristor and one electron-activated transistor electrically connected in parallel as at least one switch element.

4. A method of contactless testing an integrated circuit as set forth in claim 1 wherein:
   the fabrication step includes forming at least two transistors with base regions thereof in close proximity as switch elements.

5. A method of contactless testing of an integrated circuit as set forth in claim 1 comprising:
   E. thereafter electrically disconnecting each semiconductor switch element from the integrated circuit; and
   F. selectively electrically connecting segments of the integrated circuit that have tested good.

6. A method of contactless testing of an integrated circuit as set forth in claim 1 comprising:
   E. thereafter electrically disconnecting each semiconductor switch element from the integrated circuit; and
   F. selectively electrically disconnecting segments that have tested defective from the integrated circuit.

7. A method of contactless testing an integrated circuit comprising the steps of:
   A. fabricating integrally with each segment of an integrated circuit to be tested at least one semiconductor switch element (i) having an input adapted for electrical connection to an electrical source and an output electrically connected to an input of said segment, and (ii) having a base region configuration capable of exposure to and switching by an electron beam to supply at the connected input to said segment a desired electrical input;
   B. connecting inputs of said semiconductor switch elements to electrical sources;
   C. selectively exposing the base region of at least one test switch element with a electron beam to actuate said switch element and supply a desired electrical signal at at least one input to one said segment from the electrical source;
   D. measuring electrical responses of said segment of the integrated circuit to said electrical input to determine whether said segment possesses specified electrical characteristics; and
   E. repeating steps C and D separately with respect to at least one other said segment of the integrated circuit.

8. A method of contactless testing an integrated circuit as set forth in claim 7 wherein:
   the fabrication step includes forming a plurality of semiconductor switch elements with different resistance values and having outputs ohmically connected to one input to said integrated circuit; and
   the exposure step includes selectively supplying a plurality of electrical inputs of different voltage levels at the connected input of said integrated circuit.

9. A method of contactless testing an integrated circuit as set forth in claim 7 wherein:
   the fabrication step includes forming one electron-activated thyristor and one electron-activated transistor electrically connected in parallel as at least one switch element.

10. A method of contactless testing an integrated circuit as set forth in claim 7 wherein:
    the fabrication step includes forming at least two transistors with base regions thereof in close proximity as switch elements.

11. A method of contactless testing of an integrated circuit as set forth in claim 7 comprising in addition:
    F. thereafter electrically disconnecting each semiconductor switch element from the integrated circuit; and
    G. selectively electrically connecting segments of the integrated circuit that have tested good.

12. A method of contactless testing of an integrated circuit as set forth in claim 7 comprising in addition:
    F. thereafter electrically disconnecting each semiconductor switch element from the integrated circuit; and
    G. selectively electrically disconnecting segments that have tested defective from the integrated circuit.

* * * * *